Feb. 28, 1961 M. M. ATALLA ET AL 2,973,466

SEMICONDUCTOR CONTACT

Filed Sept. 9, 1959

INVENTORS M. M. ATALLA
E. E. LA BATE
BY H. W. Lockhart
ATTORNEY

United States Patent Office 2,973,466

Patented Feb. 28, 1961

2,973,466

SEMICONDUCTOR CONTACT

Martin M. Atalla, Mountainside, and Ernest E. La Bate, South Plainfield, N.J., assignors to Bell Telephone Laboratories, Incorporated, New York, N.Y., a corporation of New York Filed Sept. 9, 1959, Ser. No. 838,954

4 Claims. (Cl. 317—240)

Figure 1:
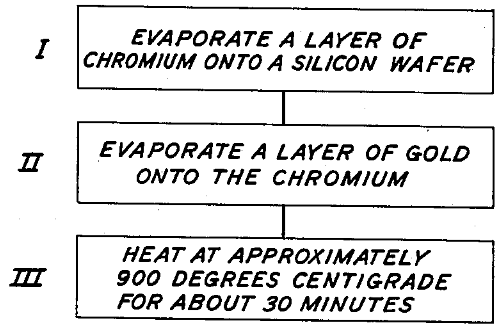

This invention relates to the fabrication of semiconductor translating devices.

More particularly the present invention relates to a high temperature contact which has a laminate structure comprising a refractory metal and a superstratum of oxidation resistant metal, the two being sintered together at their interface.

The invention has particularly useful application in relation to the passivated devices described in United States Patent Number 2,899,344 which issued to M. M. Atalla, E. J. Scheibner, and E. Tannenbaum August 11, 1959. This patent describes a method involving a specific surface treatment which includes the step of heating the wafer in an oxidizing atmosphere. The temperatures used most advantageously in this heating step are in excess of 900 degrees centigrade. Consequently, difficulties have been encountered in maintaining satisfactory electrical contacts to material thus treated, inasmuch as the usual form of contacts to semiconductive wafers lose most of their mechanical strength well below this temperature.

In particular, contacts to semiconductive wafers typically are formed by contacting a suitable metallic element to the wafer and then raising the temperature of the wafer to slightly above the eutectic temperature of the interface between the element and the wafer for bonding the element to the wafer. For the usual elements this temperature is less than 400 degrees centigrade. If the wafer is thereafter subjected to the surface treatment described above, this alloying temperature is exceeded and the device tends to be damaged by further uncontrolled alloying and melting of the contact.

Therefore, one broad object of this invention is a high temperature contact to semiconductive wafers.

Another object is a contact to silicon compatible with the above surface treatment.

In accordance with this invention, the applicants have interposed a layer of an appropriate high melting point, highly conductive material, between a metallic, oxidation resistant layer and the semiconductive wafer. Regions of what appears to be solid state recrystallization are formed at the various interfaces by heating the structure at a suitable temperature. For the purposes of this application, these regions will be referred to as sintered regions. The result is a laminated contact structure which withstands temperatures up to about 1,100 degrees centigrade.

The efficacy of the present invention depends on avoidance of alloying in the laminated contact structure. Alloying will result if a significant amount of the metallic superstratum, typically gold, penetrates the interposed layer and reaches the surface of the semiconductive wafer.

Therefore, an important feature of the present invention is a substantially impenetrable layer of high melting point, highly conductive material interposed between the contact material and the surface of the semi-conductive wafer. For the purposes of this application, the interposed layer of material will be considered substantially impenetrable if it prevents deleterious alloying.

Not only must the interposed layer be impenetrable with respect to the metallic superstratum and highly conductive as described above, but it must be of a material which forms a eutectic with the contiguous materials in the laminated structure at a temperature which is higher than any temperatures to which the device subsequently may be subjected or form no eutectic at all with these materials. Materials which satisfactorily fulfill these requirements are chromium, rhodium, cobalt, molybdenum, and tungsten, which are included in the group commonly referred to as refractory metals. However, there are difficulties encountered when either molybdenum or tungsten is employed. Both elements fulfill the temperature requirements but create some complications when used as the interposed layer because each is difficult to evaporate and is easily oxidized at high temperatures thus forming undesirable insulating oxides. Formation of this oxide can be minimized by use of an oxide resistant superstratum. However, it is not usually convenient to employ a superstratum adequate to prevent excessive oxidation when the passivation treatment described is employed. Therefore, molybdenum and tungsten are inferior refractory materials for use when the passivation treatment is to be used.

In the typical embodiment of the present invention, the interposed layer of refractory material is protected from oxidation by a metallic, oxidation resistant superstratum of gold, platinum, silver or alloys thereof. These elements are usually referred to as "noble" metals because of this oxidation resistant property. The elements are listed in order of their ability to resist oxidation. For practical purposes and especially with contacts to surfaces subsequently to be passivated, gold and platinum are most suitable.

Figure 2:
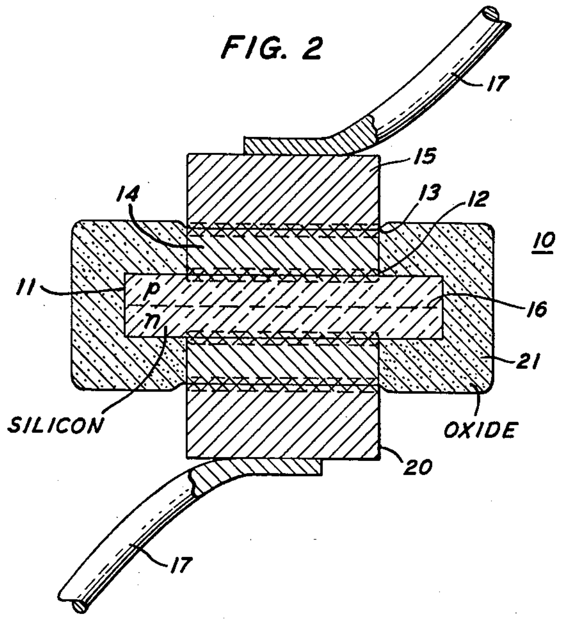

The invention and the above-noted and other features thereof will be understood more clearly and fully from the following detailed description which is rendered below with reference to the accompanying drawing in which:

Fig. 1 is a block diagram illustrating the various steps of the method of this invention; and Fig. 2 is a cross section of a contact fabricated in accordance with the method of this invention.

In the process illustrated in Fig. 1, a layer of chromium is evaporated onto a surface of a silicon wafer as indicated in block I. The chromium layer is about 1,000 Angstrom units thick. As is shown in block II, a layer of gold approximately 3,000 Angstrom units thick then is evaporated on top of the chromium. This second evaporation advantageously follows the first rather quickly to avoid any undue contamination. Both these layers are evapoarted through masks which are adapted to control the geometry of the contact. In this manner the gold is restricted to the surface of the chromium and not allowed to contact the silicon. This avoids the formation of a gold-silicon interface. The resulting laminated structure is heated thereafter as indicated in block III at about 900 degrees centigrade for approximately 30 minutes in order to form what are believed to be sintered regions at the interfaces between the gold and chromium layers and between the chromium and silicon.

Fig. 2 is a cross section of a device 10 having a pair of electrodes fabricated in accordance with the method of Fig. 1. The silicon wafer 11 contains a rectifying junction 16 formed by diffusing boron and phosphorus into the wafer by the well-known vapor solid diffusion techniques described in Patent No. 2,802,760 issued August 13, 1957, to L. Derick and C. J. Frosch and is approximately fifty mils square by ten mils thick. The chromium layer 14 is interposed between the gold layer 15 and the silicon wafer 11. The sintered regions 12 and 13 are formed at the chromium-silicon and gold-chromium interfaces, respectively. A similar ohmic contact 20 is attached to the opposite surface of the silicon wafer and leads 17 are suitably attached for example by the thermo-compression bonding technique described in the copending application Serial No. 619,639 of O. L. Anderson and H. Christensen, filed October 31, 1956, and assigned to the assignee of the present application. The oxide coating 21, grown in accordance with the method described in the application of M. M. Atalla identified above completes the device.

It is to be understood that the proportions of this device have been exaggerated in order to indicate more clearly the nature of the invention. Therefore, the dimensions of the device are not to scale.

A contact to a silicon wafer has been made in accordance with the method of the present invention as follows: A .001 x .006 inch chromium layer 1000 Angstrom units thick was evaporated centrally located ontc each of opposite large area surfaces of a silicon wafer .050 x .050 x .010 inch, in accordance with known techniques. The wafer previously had had opposing large area surfaces diffused, respectively, with boron and phosphorus to provide a P-N junction. The geometry of the chromium layer was controlled by evaporation through a suitable mask similar to the molybdenum mask described in copending application Serial No. 778,836 of D. J. Walsh, filed December 8, 1958, and assigned to the assignee of the present application. A 3000 Angstrom layer of gold then was evaporated over each chromium layer. The extent of the gold layers was similarly restricted to the surfaces of the chromium layers. To protect against overlapping, the extent of the gold layer should advantageously be slightly less than that of the chromium. The structure was thereafter heated to 900 degrees centigrade for one-half hour. Leads were attached in accordance with the teaching of the above-noted application of Anderson et al. and the surfaces of the structure thereafter were processed in accordance with the method described in the above application to M. M. Atalla et al. In this specific instance the thermal oxidation step was carried out at 960 degrees centigrade for 18 hours. An oxide film of 3000 Angstrom units resulted. The device had a breakdown voltage of 49 volts and a reverse current less than $10^{-8}$ amperes at 40 volts. The device was tested for stability by applying first a reverse bias at 100 percent relative humidity for 1000 hours, and then a reverse bias at 180 degrees centigrade for 1000 hours. No significant change in characteristics was observed. This demonstrated that the connections to the wafer had not been adversely affected by the high temperature thermal oxidation.

For evaporating the chromium, the chromium was first deposited in the tungsten filament and the pressure in the evaporation chamber was reduced to about $10^{-5}$ millimeters of mercury. Thereafter, helium was introduced and the filament was heated. This outgassed the chromium and wet it uniformly to the tungsten filament. Subsequent evaporation of the chromium was done in a vacuum of $10^{-5}$ millimeters of mercury or better. At higher pressures, for example $10^{-4}$ millimeters of mercury, nonuniform layers of chromium tend to be deposited. Additionally, these nonuniform layers readily peel off of the condensing surface. Presumably, this is caused by the formation of chromium oxides resulting from the overabundance of oxygen.

As has been stated above, the thickness of the interposed refractory layer is of considerable importance. Although the specific thickness in any particular case will vary according to the refractory metal used for this layer general limitations may be set out. The minimum thickness must be sufficient to prevent the oxidation resistant coating material from reaching the semiconductive material in sufficient quantity to alloy. At high temperatures, there will be some solid state diffusion of the metallic superstrate material into the refractory layer. In one specific case, gold on chromium, a chromium layer 1000 Angstrom units thick has been found suitable for preventing sufficient penetration by the gold to result in significant alloying with the silicon. While some gold does reach the silicon even at this thickness its amount is insufficient to produce deleterious effects. Thicknesses of less than 1000 Angstrom units of chromium have been found unsuitable to prevent such effects reliably.

The maximum limitation, on the refractory layer thickness, on the other hand, is of more practical concern. Any thickness would be compatible with the invention in principle. However, it is difficult, for example to evaporate a chromium layer of over 100,000 Angstrom units onto silicon in conventional manner utilizing a tungsten filament. Moreover, it becomes uneconomic to utilize layers in excess of such thickness. The most suitable range of thicknesses of the refractory layer is from 1000 to 3000 Angstrom units.

The metallic oxidation resistant layer, for example, gold, is most advantageously about 10,000 Angstrom units thick. However, the thickness can vary from less than 3000 Angstrom units to 100,000 Angstrom units. The optimum thickness is dictated by the desire to reduce power losses in the contact, to restrict undue solid state interdiffusion, and for ease of connecting lead wires. Gold layers in this range of thickness are characterized by low resistance.

In the particular embodiment described, the sintered regions were formed by raising the temperature of the laminated structure to 900 degrees centigrade for one-half hour. However, the particular conditions described are not critical. A suitable sintered region may be formed at the interface between two materials by heating the interface to any temperature below the eutectic of the interface and above 350 degrees centigrade. For example, the chromium-gold eutectic temperature is over 1000 degrees centigrade. Therefore a suitable sintered region may be formed at a chromium-gold interface by heating the interface to a temperature between 350 degrees and 1000 degrees centigrade for a time ranging from several hours to about 30 minutes, respectively. Likewise a suitable sintered region may be formed between chromium and silicon by heating the interface to a temperature between 350 degrees and 1000 degrees centigrade at temperatures ranging similarly as above.

Evaporation from tungsten filaments has been found most efficient in the deposition of both the oxidation resistant and refractory materials. However, this is not the only method of deposition feasible. Other known techniques such as electroplating and sputtering are suitable. In some instances, as in the case where rhodium is to be deposited by plating, it may be advantageous to interpose a layer of some other suitable material intermediate between the refractory metal layer and the semiconductor. Specifically, if rhodium is chosen as the refractory material, and if the rhodium is plated onto a silicon surface, as is known, a thin nickel plating is required as a substrate and the nickel plated wafer must be heated to 800 degrees centigrade before the rhodium is plated. The rhodium is then plated onto this nickel layer and the gold is deposited onto the rhodium. The structure thereafter is heated to approximately 650 degrees centigrade in steam at a pressure of about 120 atmospheres to form the sintered regions.

Contacts to most semiconductive materials may be fabricated in accordance with the method of this invention. For example, germanium, silicon and other compound semiconductors provide suitable semiconductive bases to which the contact may be integrated. However, the maximum temperature at which the contact will operate properly will depend on the melting point of the semiconductive material and the resulting eutectics of the integrated system.

The above-described specific embodiment is susceptible of numerous and varied modifications, all clearly within the spirit and scope of the principles of the present invention, as will at once be apparent to those skilled in the art. No attempt has here been made to illustrate exhaustively all such possibilities.

What is claimed is:

1. A laminate contact to a semiconductive wafer comprising an oxidation resistant layer, a first sintered region formed in situ, a substantially impenetrable refractory layer and a second sintered region formed in situ respectively which second sintered region forms an intimate attachment to said wafer.

2. A high temperature ohmic contact to a silicon wafer comprising, successively, a gold layer, a sintered gold-chromium region formed in situ, a substantially impenetrable chromium layer and a sintered chromium-silicon region formed in situ and intimately connected to said silicon wafer.

3. A high temperature ohmic contact to a silicon wafer comprising, successively, an approximately 3000 Angstrom unit thick gold layer, a sintered gold-chromium region formed in situ, an approximately 1000 Angstrom unit thick chromium layer and a sintered chromium-silicon region formed in situ and intimately connected to said silicon wafer.

4. A semiconductor device comprising a silicon wafer having therein at least two regions of opposite conductivity defining therebetween a rectifying junction, a laminated contact to each of said regions including respectively a gold layer, a sintered gold-chromium region formed in situ, a substantially impenetrable chromium layer and a sintered chromium-silicon region formed in situ and intimately connected to said silicon wafer, a lead wire to each of said laminated contacts and an oxide coating covering the entire structure except said gold layers and lead wires.

References Cited in the file of this patent

UNITED STATES PATENTS

| | | |
|---|---|---|
| 2,813,326 | Liebowitz | Nov. 19, 1957 |
| 2,836,878 | Shepard | June 3, 1958 |
| 2,878,432 | Armstrong et al. | Mar. 17, 1959 |
| 2,898,528 | Patalong | Aug. 4, 1959 |